(12) United States Patent
Lisiansky et al.

(10) Patent No.: US 8,722,484 B2
(45) Date of Patent: May 13, 2014

(54) HIGH-K DIELECTRIC STACK AND METHOD OF FABRICATING SAME

(75) Inventors: Michael Lisiansky, Migdal Haemek (IL); Yakov Roizin, Migdal Haemek (IL); Alexey Heiman, Migdal Haemek (IL); Amos Fenigstein, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 1355 days.

(21) Appl. No.: 12/014,073

(22) Filed: Jan. 14, 2008

(65) Prior Publication Data

US 2009/0181530 A1   Jul. 16, 2009

(51) Int. Cl.
 *H01L 21/8238* (2006.01)
(52) U.S. Cl.
 CPC ............................ *H01L 21/823857* (2013.01)
 USPC .......................................................... 438/216

(58) Field of Classification Search
 None
 See application file for complete search history.

(56) References Cited

U.S. PATENT DOCUMENTS

| | | | |
|---|---|---|---|
| 6,521,527 B1 | 2/2003 | Kuroi et al. | |
| 6,933,218 B1 | 8/2005 | Lee et al. | |
| 7,002,224 B2 | 2/2006 | Li | |
| 7,138,692 B2 * | 11/2006 | Tamura et al. | 257/412 |
| 2006/0131672 A1 * | 6/2006 | Wang et al. | 257/410 |

* cited by examiner

*Primary Examiner* — William D Coleman
(74) *Attorney, Agent, or Firm* — Bever, Hoffman & Harms, LLP; E. Eric Hoffman

(57) ABSTRACT

A method for improving the reliability of a high-k dielectric layer or a high-k dielectric stack by forming an amorphous high-k dielectric layer over an insulating layer, doping the amorphous high-k dielectric layer with nitrogen atoms, and subsequently heating the resulting structure at a temperature greater than or equal to the crystallization temperature of the high-k dielectric material, thereby transforming the high-k dielectric material from an amorphous state to a crystalline state, and causing nitrogen atoms to diffuse into the insulating layer.

24 Claims, 15 Drawing Sheets

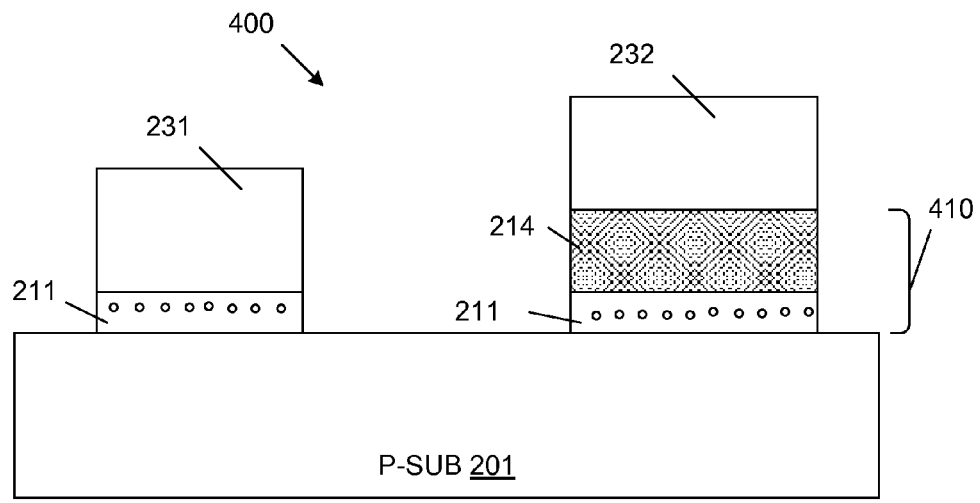
FIG. 4
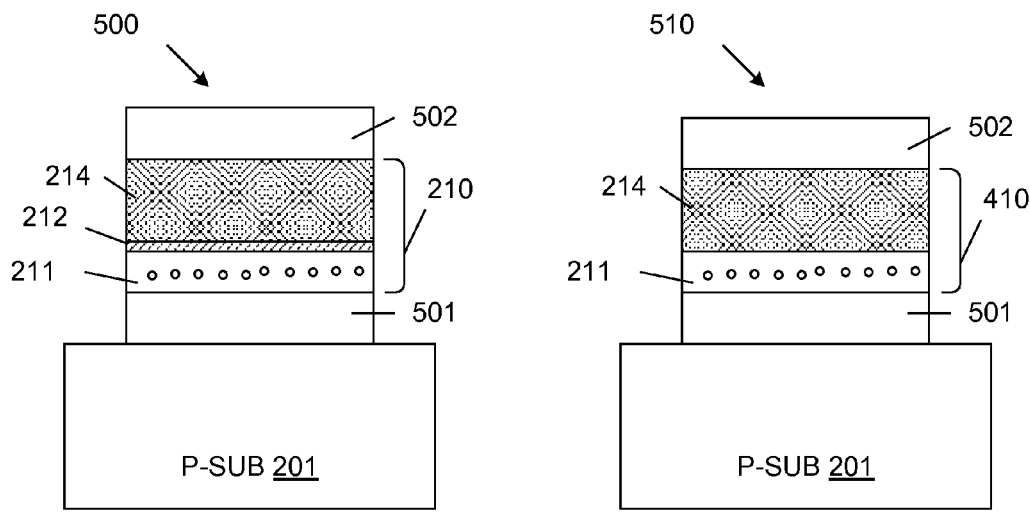
FIG. 5A                    FIG. 5B

HIGH-K DIELECTRIC STACK AND METHOD OF FABRICATING SAME

FIELD OF THE INVENTION

The present invention relates to high-k dielectric stacks. More specifically, the present invention relates to high-k dielectric stacks having a nitrided crystalline high-k dielectric layer and a silicon oxide layer that is nitrided by outdiffusion from the nitrided crystalline high-k dielectric layer.

RELATED ART

In the past, nitrogen has been introduced during the fabrication of semiconductor devices in order to modify the characteristics of these semiconductor devices.

For example, U.S. Pat. No. 6,521,527 to Kuroi et al. describes a semiconductor device that includes a gate electrode that is doped with nitrogen, by directly introducing the nitrogen into the top portion of the electrode by ion implantation. The nitrogen occupies holes which would have provided diffusion paths for impurities that are subsequently introduced to the gate electrode. Thus, the nitrogen inhibits the out-diffusion of the impurities from the gate electrode to an underlying gate insulating film. In addition, the nitrogen implanted in the gate electrode is diffused into the gate insulating film, without damaging the gate insulating film or introducing hydrogen into the gate insulating film. Introducing nitrogen to the gate insulating film improves the reliability and hot carrier resistance of the gate insulating film. However, the conductive properties of the gate electrode (i.e., polysilicon sheet resistance) will necessarily be degraded by the introduction of nitrogen into the gate electrode. Moreover, a major portion of the introduced nitrogen remains in the gate electrode (polysilicon) during subsequent post doping bakes (due to a high segregation coefficient) and does not provide strong nitridization of the underlying gate insulating film.

Accordingly, it would be desirable to have an improved method for introducing nitrogen to a gate insulating film, which does not require nitrogen doping of an overlying gate electrode.

FIG. 1 is a cross sectional view of a conventional transistor 100 having a doped gate dielectric, as described by U.S. Pat. No. 7,002,224 to Li. Li teaches that prior to depositing gate dielectric material 108 and gate material 110, a dopant species, such as nitrogen and/or fluorine, is introduced into the top surface of the semiconductor substrate 102 to form a doped region 116. Li further teaches that, in one embodiment, an anneal process used to form the source region S and the drain region D also causes the outdiffusion of the dopant species in the doped region 116 of the semiconductor substrate 102 through the optional thin insulating layer 112 and into the gate dielectric 108 to form a doped gate dielectric 118. Note that the gate dielectric is indicated by reference number 108/118, wherein 108 is representative of the gate dielectric in an undoped state, e.g., before annealing, and wherein 118 is representative of the gate dielectric in a doped state, e.g., after an anneal process. Although the gate dielectric material is doped with nitrogen, the channel area of the resulting transistor 100 will necessarily be influenced by the implant required to initially introduce the dopant species 114 into the semiconductor substrate 102. Consequently, the operating characteristics of transistor 100 will be degraded with respect to a conventional CMOS transistor.

Accordingly, it would be desirable to have a gate dielectric layer that does not adversely affect the channel region of the resulting transistor.

U.S. Pat. No. 6,933,218 to Lee et al. describes an inter-gates insulating (IGI) layer that is sandwiched between a floating gate and a control gate of a multi-gate structure. To form this IGI layer, nitrogen atoms are incorporated into an amorphous metal oxide composition by low temperature plasma nitridation in a plasma reactor. The temperature of the nitridation process is intentionally maintained below the recrystallization temperature of the constituent amorphous metal oxide, so that the high-K metal oxide will substantially retain its amorphous structure during nitridatation, and so that the amorphous metal oxide will not develop large numbers of crystal grain boundaries or otherwise undergo undesirable phase changes. However, the absence of a high temperature anneal after a heavy implantation results in a large number of structural defects degrading the electrical performance of the IGI layer (e.g., trapping of charge, leakage channels).

It would therefore be desirable to have an inter-gates insulating layer that can be fabricated without requiring low temperatures intended for maintaining an amorphous structure of a metal oxide layer. It would further be desirable if such an inter-gates insulating layer does not require plasma processing.

SUMMARY

Accordingly, the present invention provides a method for improving the reliability of a high-k dielectric layer or a high-k dielectric stack by forming an amorphous high-k dielectric layer over a silicon oxide layer, doping the amorphous high-k dielectric layer with nitrogen atoms, and subsequently baking the resulting structure at a temperature greater than or equal to the crystallization temperature of the high-k dielectric material, thereby transforming the high-k dielectric material from an amorphous state to a crystalline state.

During the bake, the silicon oxide layer becomes heavily nitrided by the outdiffusion of nitrogen atoms from the high-k dielectric material. The heavily nitrided silicon oxide layer can be used to implement a gate dielectric layer in a CMOS transistor and/or a bottom oxide layer of an ONA (oxide-nitride-alumina) memory stack.

The crystalline high-K dielectric layer of the proposed process also enables the fabrication of high/low voltage transistors and capacitors with a high specific capacitance and a high reliability. To implement a gate dielectric layer in a low voltage CMOS transistor, the crystalline high-K dielectric layer can be selectively etched from the surface of the underlying heavily nitrided silicon oxide layer (after high-temperature baking). In other embodiments the heavily nitrided silicon oxide layer and nitrided crystalline high-k dielectric layer is used as the gate dielectric of a high voltage CMOS transistor (or capacitor). The proposed process enables the integration of memory devices based on ONA stacks into a CMOS process flow.

The present invention will be more fully understood in view of the following description and drawings.

BRIEF DESCRIPTION OF THE DRAWINGS

FIG. 4 is a cross sectional view of a crystalline high-k dielectric stack in accordance with an alternate embodiment of the present invention.

FIGS. 5A and 5B are cross sectional views of semiconductor capacitor structures which are constructed using crystalline high-k dielectric stacks of the present invention.

DETAILED DESCRIPTION

FIGS. 2A, 2B, 2C, 2D and 2E are cross sectional views of a high-k dielectric stack during various stages of fabrication, in accordance with one embodiment of the present invention.

Figure 1:
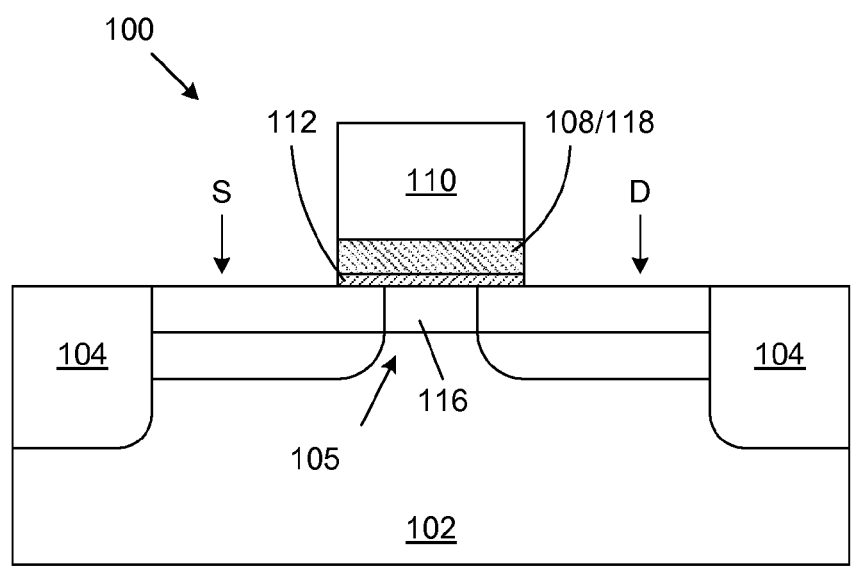
FIG. 1 is a cross-sectional view of a conventional semiconductor structure having a nitrogen-doped gate dielectric layer.
Figure 2A:
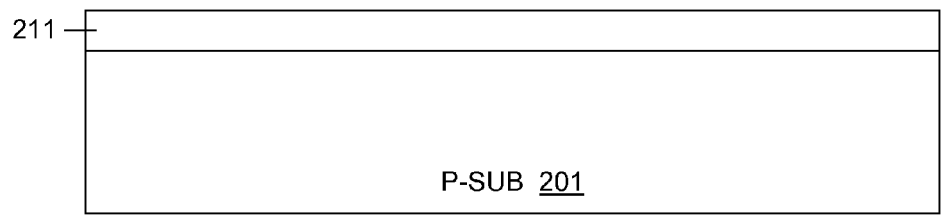
FIGS. 2A, 2B, 2C, 2D and 2E are cross sectional views illustrating various steps in the fabrication of a crystalline high-k dielectric stack in accordance with one embodiment of the present invention.

As illustrated in FIG. 2A, an insulating layer 211 is formed over an upper surface of a semiconductor substrate 201. In the described embodiment, substrate 201 is p-type monocrystalline silicon. Semiconductor substrate 201 may have an n-type conductivity in other embodiments. Insulating layer 211 can be fabricated using the same growth conditions used to form the first layer of a conventional ONO structure or a CMOS transistor gate dielectric layer. For example, insulating layer 211 can be silicon oxide formed by dry thermal oxidation of the underlying silicon substrate 201. Insulating layer 211 can be formed in other manners in other embodiments. In accordance with one embodiment, the thickness of silicon oxide layer 211 is selected to correspond with a desired gate dielectric thickness of CMOS transistors to be fabricated on substrate 201. The thickness of silicon oxide layer 211 may further be selected to prevent (or minimize) the leakage of charge between a subsequently formed charge trapping layer (e.g., silicon nitride layer 212) and semiconductor substrate 201. In a particular embodiment, the thickness of silicon oxide layer 211 is about 40 Angstroms.

Figure 2B:
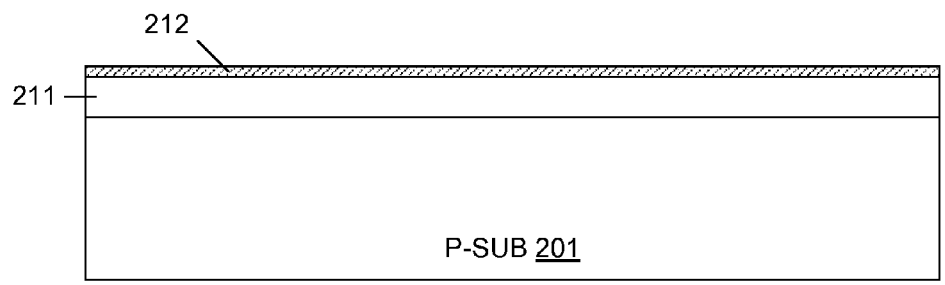

As illustrated in FIG. 2B, an optional silicon nitride or silicon oxynitride layer 212 is subsequently formed over silicon oxide layer 211. Silicon nitride/oxynitride layer 212 can be fabricated using the same growth conditions used in a conventional ONO structure. For example, silicon nitride/oxynitride layer 212 can be formed by chemical vapor deposition (CVD) of silicon nitride from dichlorosilane/ammonia mixture (1:10) at 680° C. In the described embodiments, silicon nitride/oxynitride layer 212 (if present) has a relatively small thickness of about 10 to 20 Angstroms. Other conventional methods of forming a silicon nitride/oxynitride layer can be used in other embodiments. Moreover, silicon nitride/oxynitride layer 212 can have other thicknesses in other embodiments.

Figure 2C:
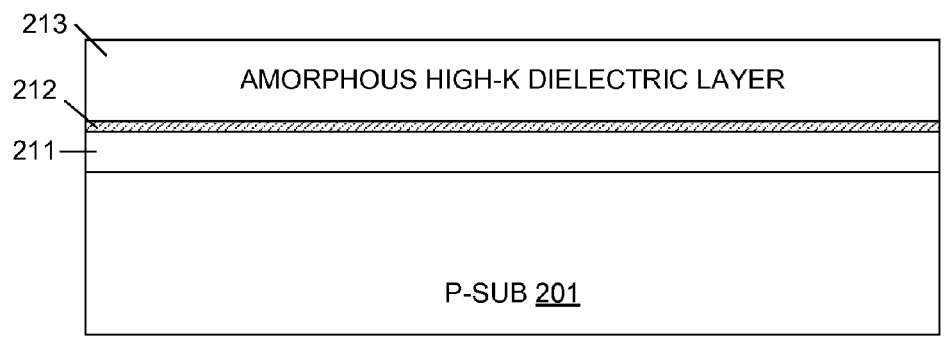

As illustrated in FIG. 2C, an amorphous high-k dielectric layer 213 is formed over silicon nitride/oxynitride layer 212. In the described embodiments, the amorphous high-k dielectric layer 213 is a metal oxide, such as aluminum oxide (i.e., alumina). In accordance with other embodiments, amorphous high-k dielectric layer 213 may be a metal oxynitride or silicate. For purposes of the present specification, a high-k dielectric material has a dielectric constant k greater than or equal to 7.0.

The thickness of amorphous high-k dielectric layer 213 is selected such that the resulting stacked dielectric structure (FIG. 2E) exhibits a desired effective oxide thickness (EOT). In the described embodiments, amorphous high-k dielectric layer 213 has an initial thickness in the range of about 20-400 Angstroms.

Figure 2D:
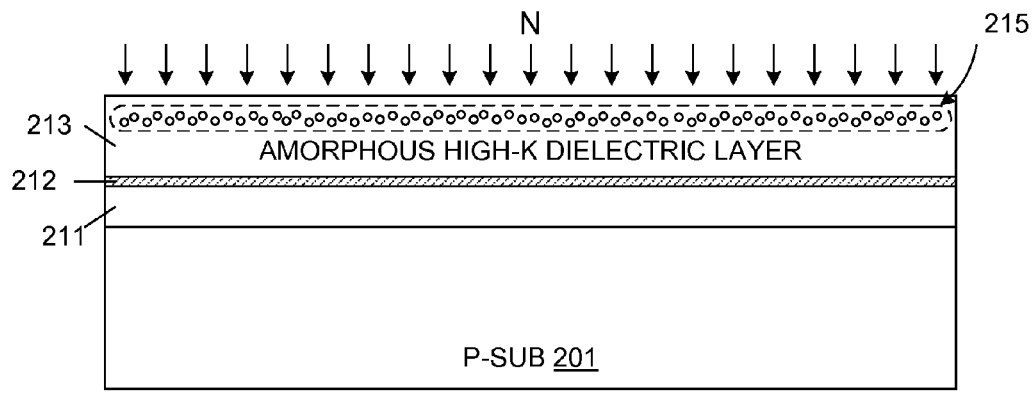

As shown in FIG. 2D, nitrogen is then introduced into the amorphous high-k dielectric layer 213. In accordance with one embodiment, nitrogen ions 215 are implanted into the upper surface of amorphous high-k dielectric layer 213 with an energy in the range of about 10 eV to about 15 KeV (depending upon the thickness of the high-k dielectric layer 213) and a dosage in the range of about 1E13 to 1E16 $cm^{-2}$. In other embodiments, nitrogen may be introduced into amorphous high-k dielectric layer 213 by other methods, such as plasma treatment and/or performing one or more bakes in a gas environment containing nitrogen atoms (e.g., $N_2$, $N_2O$, NO and/or $NH_3$, including neutral or activated species.)

In one embodiment, the energy of the implanted nitrogen ions 215 is selected to be low enough that these ions do not to penetrate into silicon oxide layer 211. As a result, the introduction of nitrogen ions 215 does not damage the silicon oxide layer 211.

Figure 2E:
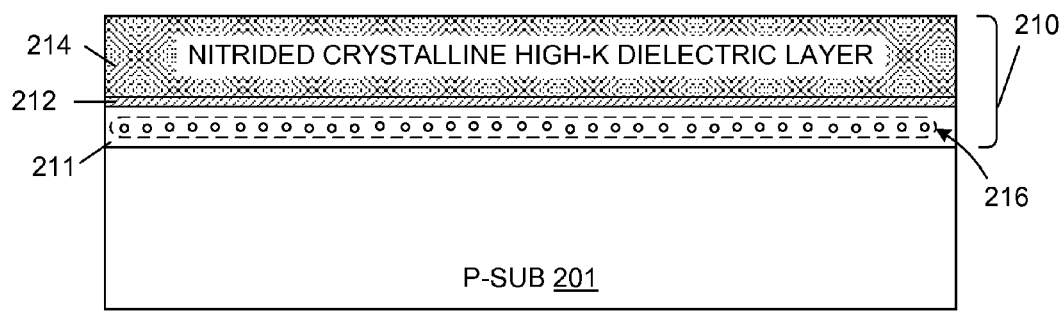

As illustrated in FIG. 2E, the resulting structure is heated to a temperature that equals or exceeds the crystallization temperature of amorphous high-k dielectric layer 213. In the described embodiment, this temperature equals or exceeds 830° C., which represents the crystallization temperature of amorphous alumina. When processing is complete, the amorphous high-k dielectric layer 213 is transformed into a nitrided crystalline high-k dielectric layer 214. The nitrogen ions 215 exhibit a low segregation coefficient in the crystalline high-k dielectric layer 214 (in contrast with the high segregation coefficient exhibited by nitrogen in polysilicon), thereby resulting in an efficient out-diffusion of atomic nitrogen from this layer 214 into the adjacent silicon oxide layer 211. The nitrogen that diffuses into silicon oxide layer 211 is labeled with reference number 216 in FIG. 2E. As a result, silicon oxide layer 211 advantageously becomes strongly nitrided, without having to introduce nitrogen directly into the underlying substrate 201, or into an overlying gate electrode (which has not yet been formed). Because nitrogen atoms suppress transverse diffusion, abrupt interfaces between the crystalline high-k dielectric layer 214 and the adjoining dielectric films is achieved. The abrupt interface and the highly ordered nitrided crystalline high-k dielectric layer 214 cause the resulting dielectric stack 210 to exhibit high reliability. As described in more detail below, the crystalline high-k dielectric stack 210 can be used to create various semiconductor structures in accordance with various embodiments of the present invention.

Figure 3A:
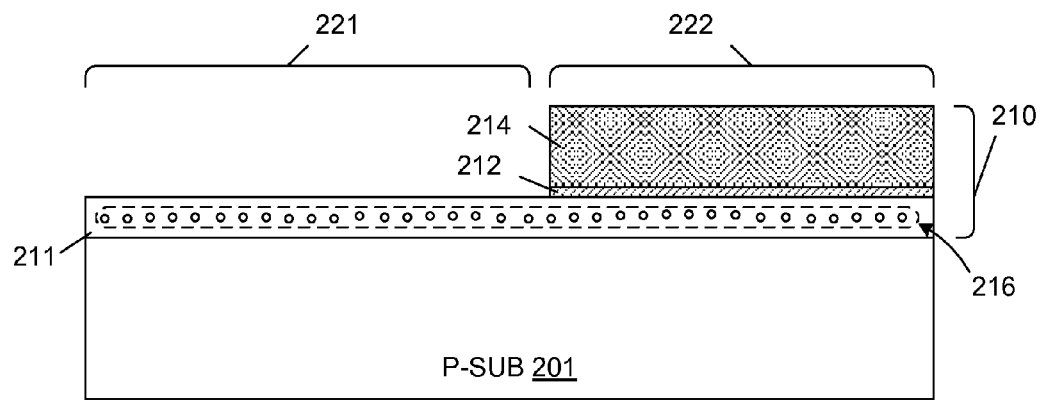
FIGS. 3A, 3B, 3C and 3D are cross sectional views illustrating the manner in which the crystalline high-k dielectric stack of FIG. 2E may be further processed to form both an ONO based memory device and a CMOS transistor, in accordance with one embodiment of the present invention.
Figure 3B:
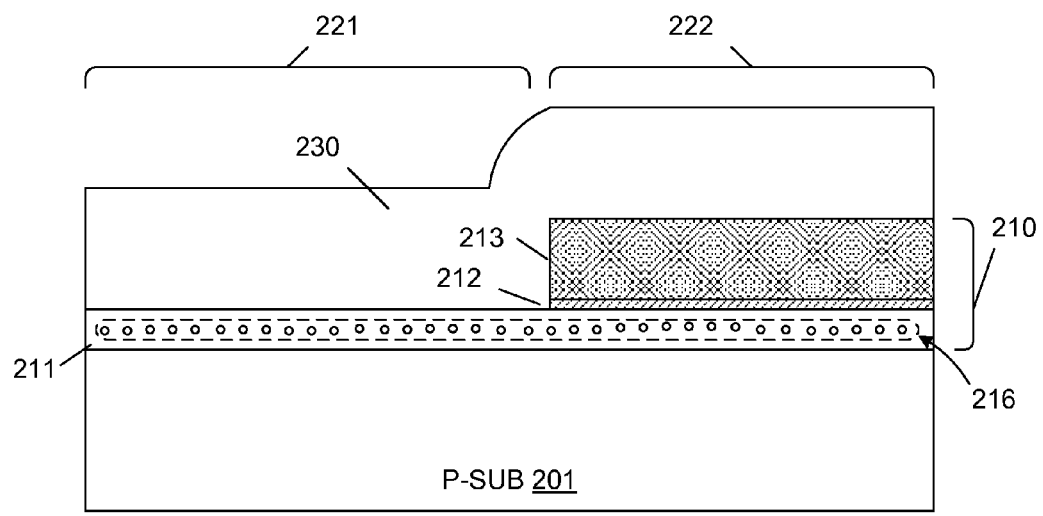
Figure 3C:
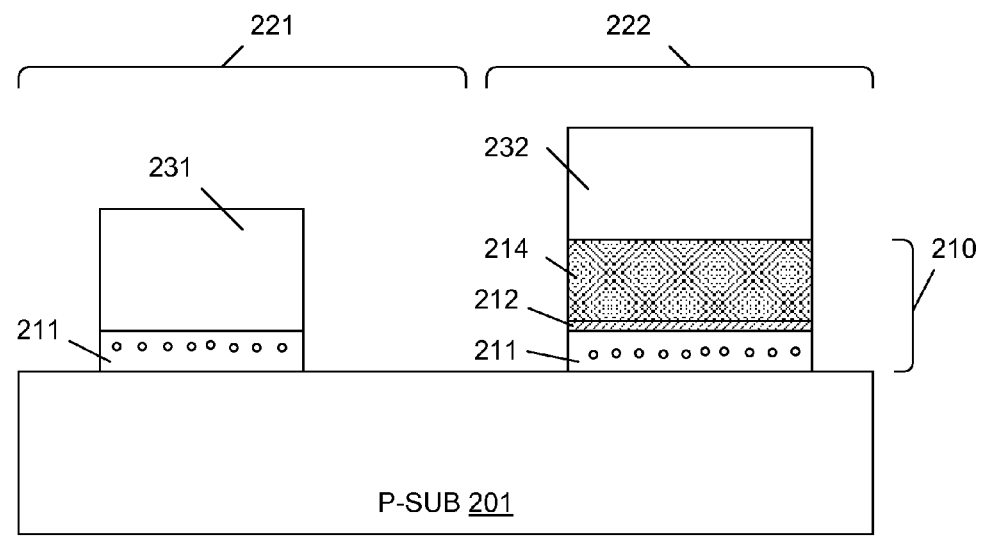

For example, as illustrated in FIGS. 3A-3C, the crystalline high-k dielectric stack 210 can be processed to form both an ONO based memory device and a CMOS transistor.

As illustrated in FIG. 3A, the crystalline high-k dielectric stack 210 can be patterned and etched to define two separate regions 221 and 222. In a first region 221, the crystalline high-k dielectric layer 214 and the silicon nitride/oxynitride layer 212 are removed, leaving nitrided silicon oxide layer 211. In the second region 222, the crystalline high-k dielectric stack 210 remains intact.

As shown in FIG. 3B, a conductive gate electrode layer 230 (e.g., polysilicon) is formed over the resulting structure. The conductive gate electrode layer 230 is subsequently patterned as illustrated in FIG. 3C, thereby forming gate electrodes 231 and 232. In accordance with one embodiment of the present invention, gate electrode 231 and strongly nitrided silicon oxide layer 211 can be used to create a low-voltage CMOS transistor in a manner known to those of ordinary skill in the art. Similarly, gate electrode 232 and crystalline high-k dielectric stack 210 can be used to form an ONO based memory cell in a manner known to those of ordinary skill in the art. Advantageously, the heavily nitrided silicon oxide layer 211 is used in both the CMOS transistor structure and the ONO based memory cell structure, thereby simplifying the fabrication process.

Figure 3D:
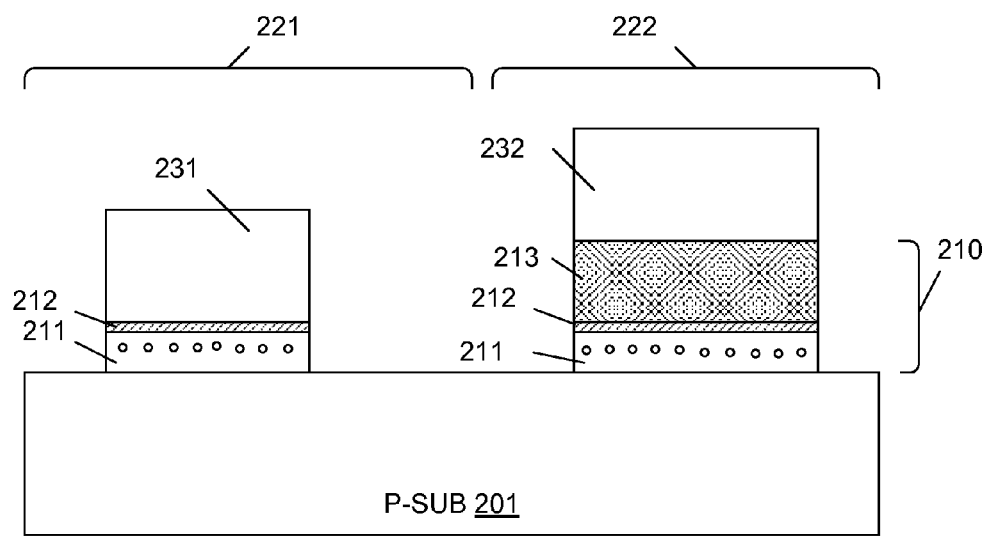

In one variation of the embodiment illustrated by FIGS. 3A-3C, the silicon nitride/oxynitride layer 212 is not removed in the first region 221 during the step illustrated in FIG. 3A, thereby resulting in a CMOS transistor gate dielectric that includes both nitrided silicon oxide layer 211 and silicon nitride/oxynitride layer 212, as illustrated in FIG. 3D.

FIG. 4 is a cross sectional view of a semiconductor structure 400 in accordance with another embodiment of the present invention, wherein the optional silicon nitride/oxynitride layer 212 is not formed in the step illustrated in FIG. 2B. Omitting silicon nitride/oxynitride layer 212 results in the formation of a crystalline high-k dielectric stack 410 that includes only nitrided silicon oxide layer 211 and nitrided crystalline high-K dielectric layer 214.

FIG. 5A is a cross sectional view of a semiconductor capacitor structure 500 in accordance with yet another embodiment of the present invention, wherein the crystalline high-k dielectric structure 210 is located between two conductive capacitor electrodes 501 and 502. In accordance with one embodiment, electrodes 501 and 502 are formed of a metal composite and/or metal. Electrodes 501 and 502 may also be formed of conductively doped monocrystalline silicon and/or conductively doped polysilicon. A dielectric material (not shown) typically isolates electrode 501 from substrate 201. Semiconductor capacitor structure 500 is commonly used to form MIM (metal-insulator-metal) capacitors.

FIG. 5B is a cross sectional view of a semiconductor capacitor structure 510 in accordance with a variation of the embodiment of FIG. 5A, wherein the crystalline high-k dielectric structure 410 of FIG. 4 is located between the two conductive capacitor electrodes 501 and 502. Again, dielectric material (not shown) typically isolates electrode 501 from substrate 201.

Figure 6:
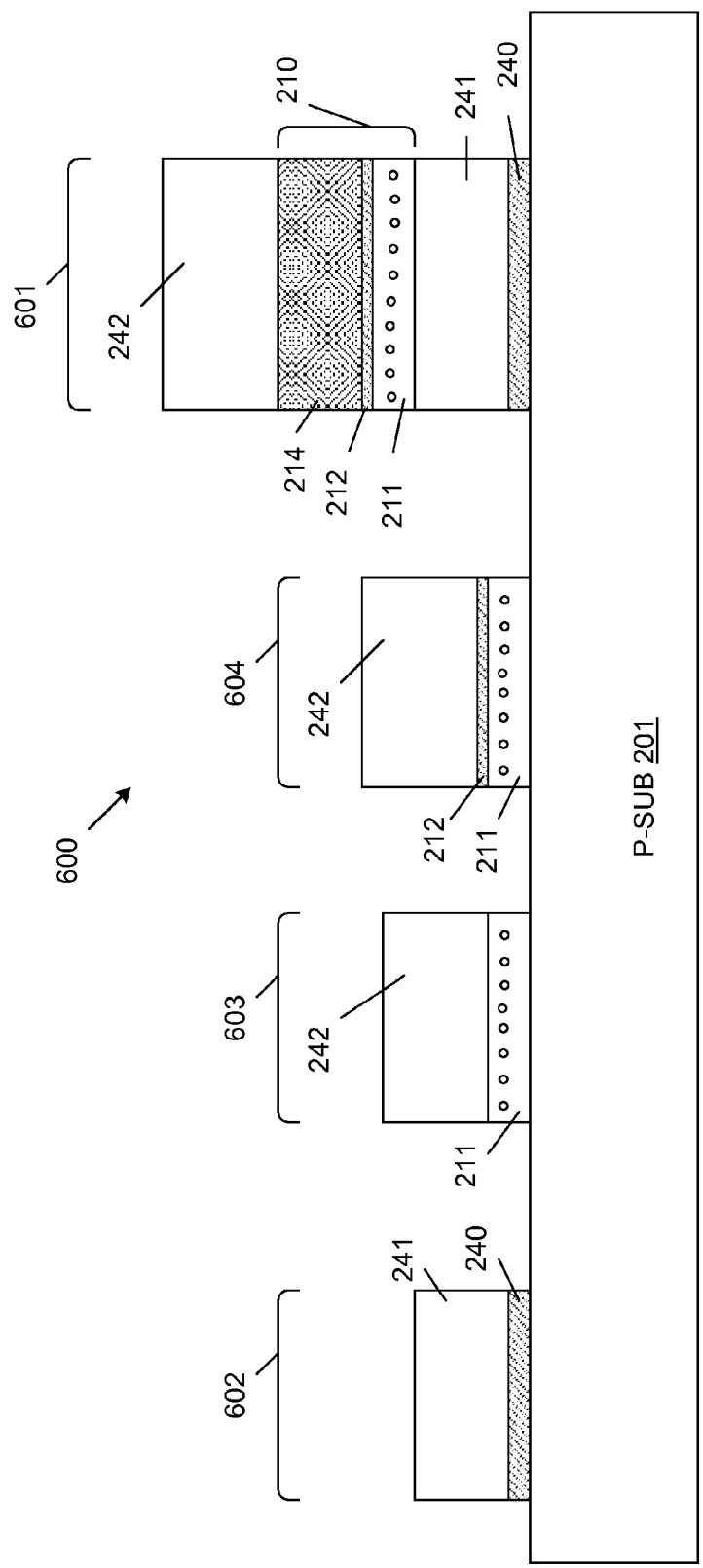
FIG. 6 is a cross sectional view of a multi-gate semiconductor structure that uses a crystalline high-k dielectric stack of the present invention to form an inter-gates insulating layer.

FIG. 6 is a cross sectional view of a semiconductor structure 600 in accordance with yet another embodiment of the present invention, wherein the crystalline high-k dielectric structure 210 forms an inter-gates insulating (IGI) layer that is sandwiched between a floating gate 241 and a control gate 242 of a multi-gate structure 601. This multi-gate structure can be used to construct an EEPROM cell in a manner known to those of ordinary skill in the art. Note that gate dielectric layer 240 isolates floating gate 241 from substrate 201. Possible CMOS gate electrode/gate dielectric structures 602, 603 and 604, which can be derived from the various layers of multi-gate structure 601, are also illustrated in FIG. 6. Similar layers are labeled with similar reference numbers in FIG. 6. In an alternate embodiment, silicon nitride/oxynitride layer 212 is eliminated from the structure of FIG. 6.

FIGS. 7A-7H are cross sectional views of a high-k dielectric stack during various stages of fabrication, in accordance with alternate embodiments of the present invention.

Figure 7A:
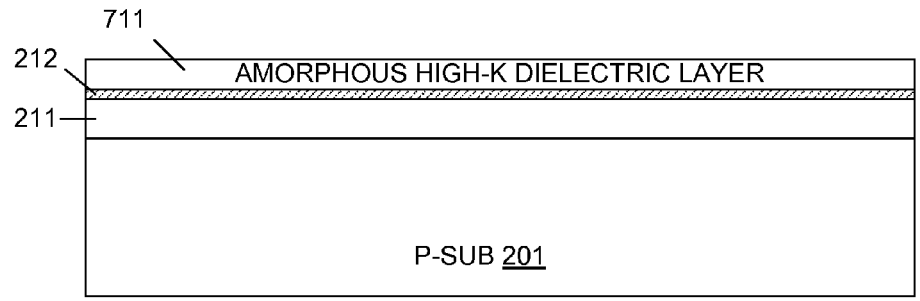
FIGS. 7A, 7B, 7C, 7D, 7E, 7F, 7G and 7H are cross sectional views illustrating various steps in the fabrication of a crystalline high-k dielectric stack having multiple layers of high-k dielectric material in accordance with an alternate embodiment of the present invention.

As illustrated in FIG. 7A, silicon oxide layer 211 and optional silicon nitride/oxynitride layer 212 are fabricated over substrate 201 in the manner described above in connection with FIGS. 2A-2B. A first thin amorphous high-k dielectric layer 711 is then formed over the resulting structure. In the described example, amorphous high-k dielectric layer 711 has a thickness in the range of about 10 to 100 Angstroms.

Figure 7B:
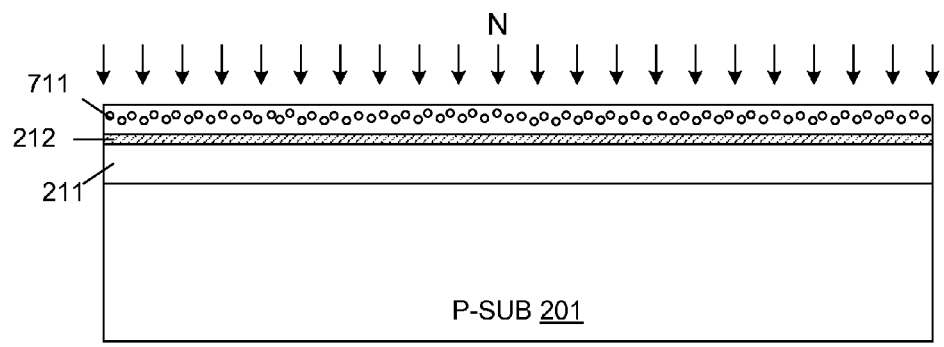

As shown in FIG. 7B, nitrogen is then introduced to amorphous high-k dielectric layer 711 in the manner described above in connection with FIGS. 2A-2E.

Figure 7C:
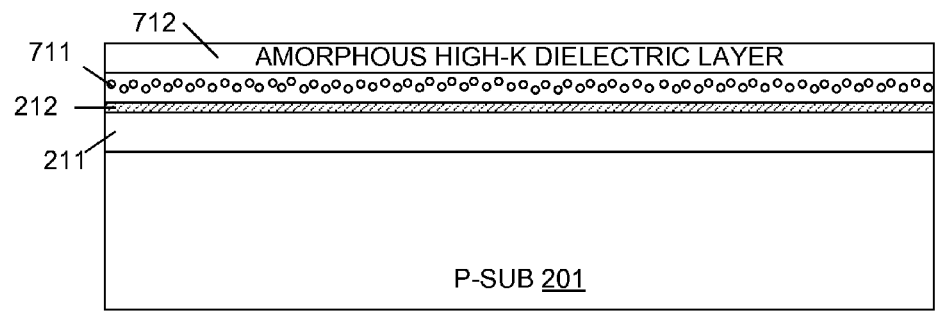

As illustrated in FIG. 7C, a second thin amorphous high-k dielectric layer 712 is formed over the first thin amorphous high-k dielectric layer 711. In the described example, the second amorphous high-k dielectric layer 712 has a thickness in the range of about 10 A to 100 Angstroms. Amorphous high-k dielectric layers 711 and 712 may be fabricated of the same material, such as alumina. Alternately, amorphous high-k dielectric layers 711 and 712 may be fabricated of different materials.

An anneal of the structure in FIG. 7C is then performed so that at least the first amorphous high-k dielectric layer 711 is crystallized. As described in more detail below, the second amorphous high-k dielectric layer 712 may or may not be crystallized by this anneal.

Figure 7D:
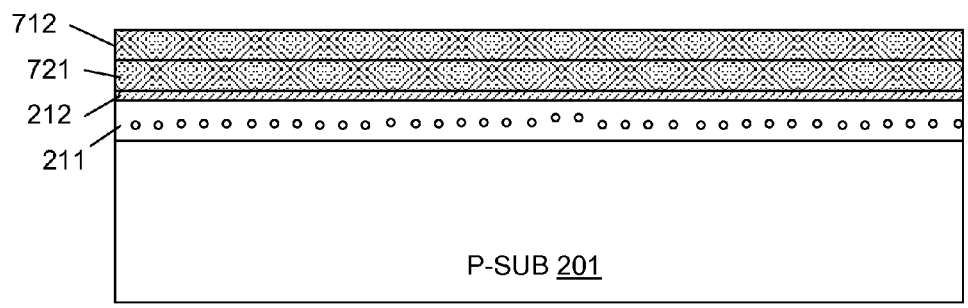

It is important to note that the formation of the high-k dielectric stack of the present invention must take into account the thermal budget of the associated process. If the process has a relatively high thermal budget, it should be possible to perform the anneal at a high temperature (e.g., greater than 830° C.). In this case, the anneal may crystallize both the first and second amorphous high-k dielectric layers 711 and 712 to form crystalline high-k dielectric layers 721 and 722, and cause the out-diffusion of nitrogen to silicon oxide layer 211, as illustrated in FIG. 7D. Both of the amorphous high-k dielectric layers 711 and 712 may have relatively high crystallization temperatures (e.g., greater than 830° C.) in this embodiment. For example, both the first and second amorphous high-k dielectric layers 711 and 712 may be alumina. Alternately, the first and second amorphous high-k dielectric layers may be different materials, each having a crystallization temperature less than the anneal temperature.

If the process has a relatively low thermal budget, then the amorphous high-k dielectric layer 711 may need to be implemented with a material having relatively a low crystallization temperature, thereby allowing the nitrogen doped amorphous high-k dielectric layer 711 to be crystallized without exceeding the thermal budget. Note that a process may have a relatively low thermal budget if the back end metals of the process have a relatively low melting point (like in the case of aluminium), or if there is a process temperature restriction to prevent excessive extension of diffusion regions. A back end temperature restriction with metal such as aluminum is around 500-520° C., and this requires an appropriate low thermal budget. Similarly, advanced technology nodes of 130 nm or smaller may have a process temperature restriction of 800° C. or less to prevent excessive extension of diffusion regions.

If the process has a relatively low thermal budget, the anneal may be performed at a relatively low temperature (e.g., less than 800° C.), which is sufficient to crystallize both the first and second amorphous high-k dielectric layers 711 and 712 to form crystalline high-k dielectric layers 721 and 722, and cause the out-diffusion of nitrogen to silicon oxide layer 211, as illustrated in FIG. 7D. However, both of the amorphous high-k dielectric layers 711 and 712 must have relatively low crystallization temperatures (e.g., less than the anneal temperature) in this embodiment. For example, both the first and second amorphous high-k dielectric layers 711 and 712 may be $HfO_2$. Alternately, the first and second amorphous high-k dielectric layers may be different materials, each having a crystallization temperature less than the anneal temperature.

Figure 7E:
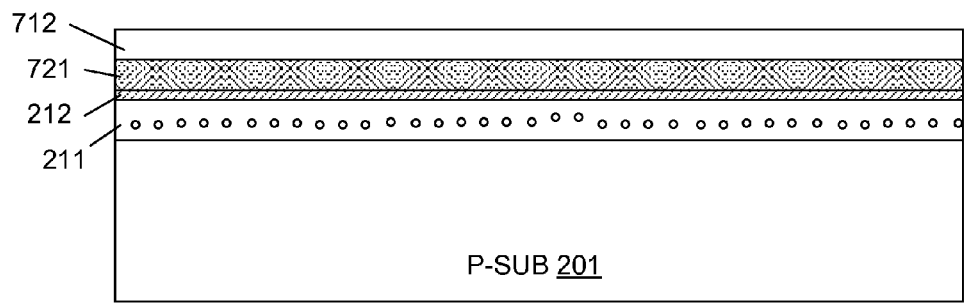

Alternately, a process having a relatively low thermal budget may implement an anneal at a temperature that is only sufficient to crystallize the first amorphous high-k dielectric layer 711 to form crystalline high-k dielectric layer 721 and cause the out-diffusion of nitrogen from high-k dielectric layer 711 to silicon oxide layer 211. However, the anneal temperature may be lower than the crystallization temperature of the second amorphous high-k dielectric layer 712, such that this layer 712 remains amorphous. The resulting structure of this embodiment is illustrated in FIG. 7E. In the present embodiment, the first amorphous high-k dielectric layer 711 has a lower crystallization temperature than the second amorphous high-k dielectric layer 712.

In one implementation of the present embodiment, the first amorphous high-k dielectric layer 711 is $HfO_2$, which has a crystallization temperature of about 450° C., the second amorphous high-k dielectric layer 712 is $Al_2O_3$, which has a crystallization temperature of about 830° C., and the anneal is performed at a temperature of 520° C. Resulting HfON crystalline layer 721 has an advantage of reduced leakage current and thermal stability compared to regular $HfO_2$ dielectric. Other material combinations for amorphous high-k dielectric layers 711 and 712 are possible and are considered within the scope of the present invention. For example, amorphous high-k dielectric layers 711 and 712 may be $HfSiO_x$ and $HfAlO_x$, respectively, which have crystallization temperatures of about 600° C. and >800° C., respectively.

Figure 7F:
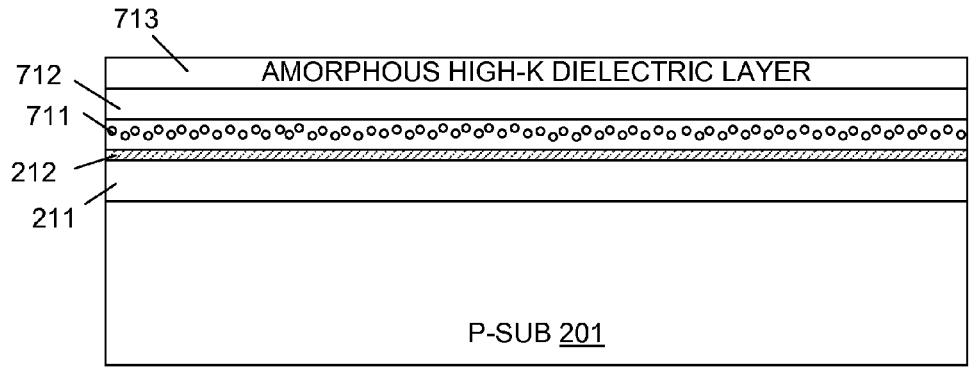

As illustrated in FIG. 7F, a third thin amorphous high-k dielectric layer 713 may be formed over the second thin amorphous high-k dielectric layer 712 of FIG. 7C. In the described example, the third amorphous high-k dielectric layer 713 has a thickness in the range of about 10 to 100 Angstroms. Amorphous high-k dielectric layers 711-713 may be fabricated of the same material (e.g., alumina). Alternately, amorphous high-k dielectric layers 711 and 713 may be fabricated the same material, while amorphous high-k dielectric layer 712 is fabricated of a different material. In this embodiment, the amorphous high-k dielectric layers 711 and 713 may have a lower crystallization temperature than amorphous high-k dielectric layer 712.

In accordance with one embodiment of the present invention, the amorphous high-k dielectric layers 711 and 713 have a crystallization temperature of less than 500° C. when a low thermal budget process is used. For example, the amorphous high-k dielectric layers 711 and 713 may be $HfO_2$, which has a crystallization temperature of about 450° C. Amorphous high-k dielectric layer 712 may be a material (e.g., alumina) having a higher crystallization temperature.

Figure 7G:
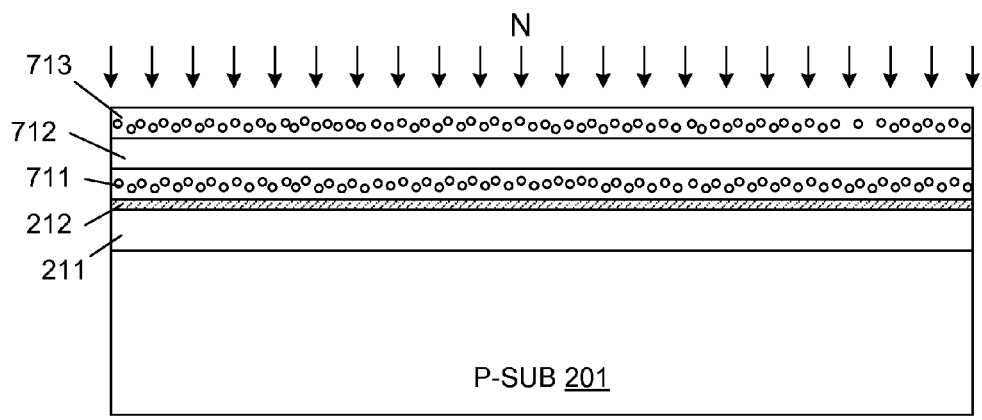

As illustrated in FIG. 7G, nitrogen is introduced to the third amorphous high-k dielectric layer 713, in the manner described above in connection with FIGS. 2A-2E.

Figure 7H:
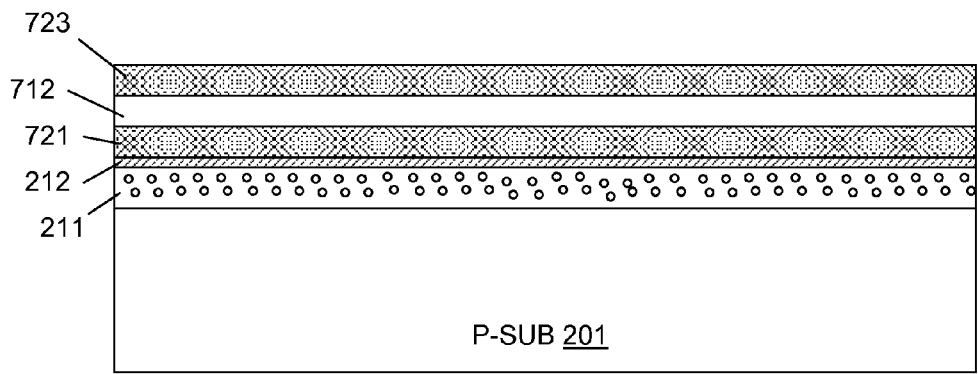

As shown in FIG. 7H, the resulting structure is heated to a temperature that equals or exceeds the crystallization temperature of nitrogen doped amorphous high-k dielectric layers 711 and 713, but does not exceed the crystallization temperature of amorphous high-k dielectric layer 712. In this embodiment, amorphous high-k dielectric layers 711 and 713 transform into HfON crystalline high-k dielectric layers 721 and 723, respectively, amorphous high-k dielectric layer 712 remains in an amorphous state, and nitrogen ions from amorphous high-k dielectric layers 711 and 713 diffuse into silicon oxide layer 211 and amorphous high-k dielectric layer 712 which improves the quality of $Al_2O_3$ film and its interfaces by preventing the lateral diffusion.

In accordance with another embodiment, the structure of FIG. 7G is annealed at a temperature that equals or exceeds the crystallization temperature of all of the amorphous high-k dielectric layers 711-713, such that all of the amorphous high-k dielectric layers 711-713 are transformed into a crystalline state.

In all the embodiments nitrogen could be introduced to amorphous high-k dielectric layer 711 and 713 by other methods described above in connection with FIGS. 2A-2E, such as plasma treatment and/or performing one or more bakes in a gas environment containing nitrogen atoms.

Other combinations and numbers of amorphous high-k dielectric layers and crystallization temperatures can be used in other embodiments.

Figure 8:
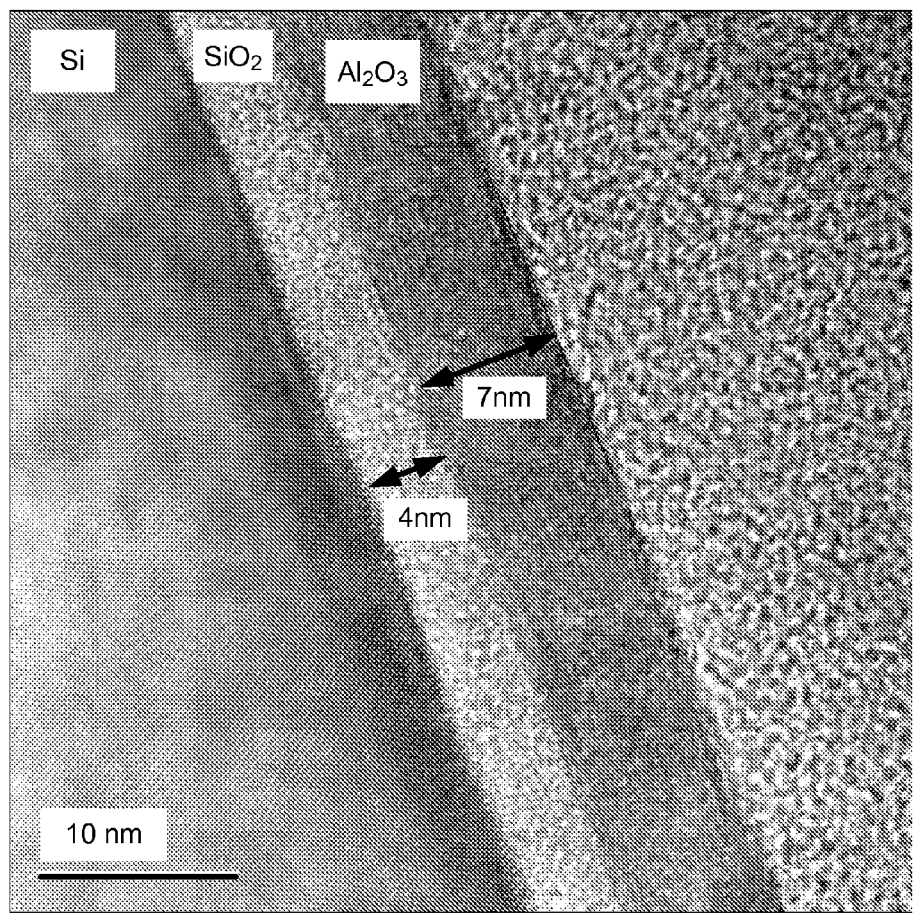
FIG. 8 is a High Resolution TEM image of an alumina-silicon dioxide (A-O) stack of the present invention after Post Deposition Annealing (PDA) at a temperature exceeding 830° C.

FIG. 8 is a High Resolution TEM image of an alumina-silicon dioxide (A-O) stack of the present invention after Post Deposition Annealing (PDA) at a temperature exceeding 830° C. In the current example, the A-O stack has a silicon dioxide thickness of about 40 Angstroms and an Atomic Layer Deposition (ALD) alumina layer with thickness of about 80 Angstroms. PDA induces crystallization and densification of the alumina layer (~15% thickness decrease). The thickness of the silicon dioxide layer does not change. There is an abrupt interface of $SiO_2$ with alumina. This is in accordance with U.S. Pat. No. 6,521,527 demonstrating that nitrogen inhibits the interdiffusion of atoms at the $Al_2O_3$—$SiO_2$ interface.

Figure 9:
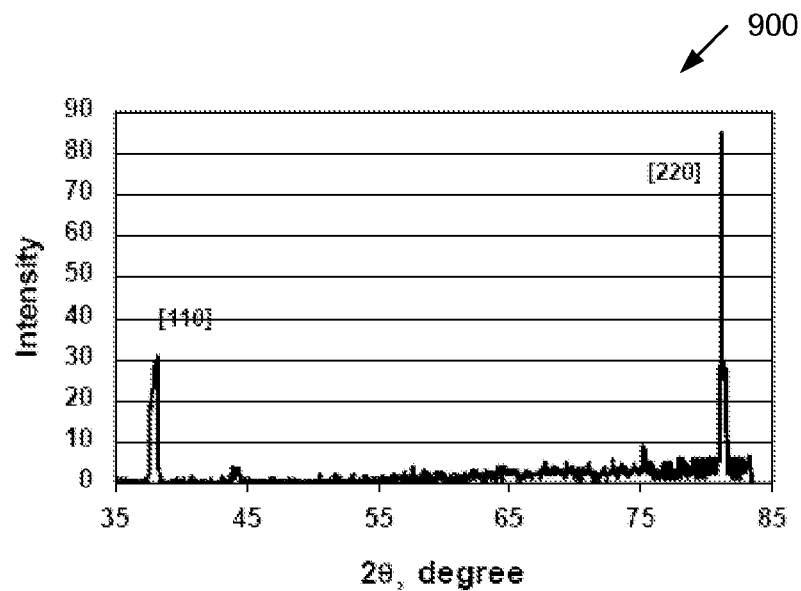
FIG. 9 is a graph of X-ray diffraction (XRD) spectra of a crystalline alumina layer of a crystalline high-k dielectric stack of the present invention.

FIG. 9 is a graph 900 of X-ray diffraction (XRD) spectra of the crystalline alumina layer of the alumina-silicon dioxide (A-O) stack shown on FIG. 8. The XRD pattern suggests that $\alpha$-$Al_2O_3$-like polymorph of alumina (corundum) dominates in the alumina crystalline structure of the present invention.

Figure 10:
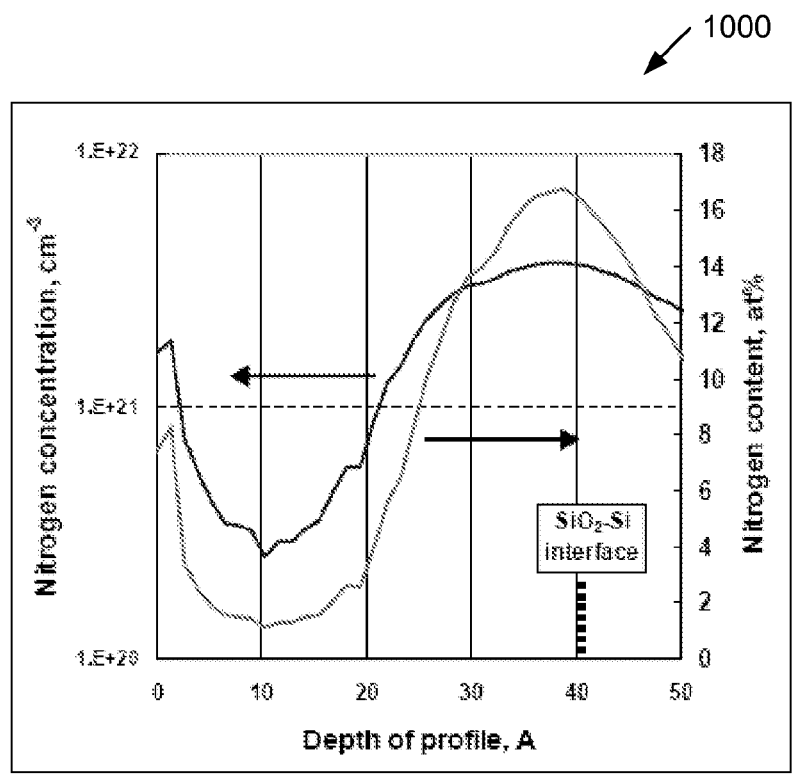
FIG. 10 is a graph illustrating the TOF SIMS profile of nitrogen in the silicon oxide layer of a proposed $SiO_2$-Alumina stack after nitrogen doping and post-deposition anneal at a temperature greater than 830° C.

FIG. 10 is a graph 1000 illustrating TOF SIMS profile of nitrogen in a silicon oxide layer of the proposed $SiO_2$-Alumina stack after nitrogen doping and post-deposition anneal at a temperature greater than 830° C. In the illustrated example, alumina is implanted with nitrogen at a dose greater than about $10^{14}$ cm−2 and an energy of about 1.5 KeV before being annealed. The silicon oxide layer is located on an underlying silicon substrate. It is seen that the concentration of nitrogen in the silicon oxide layer near its interface with the underlying silicon substrate reaches 17 at. %.

Figure 11:
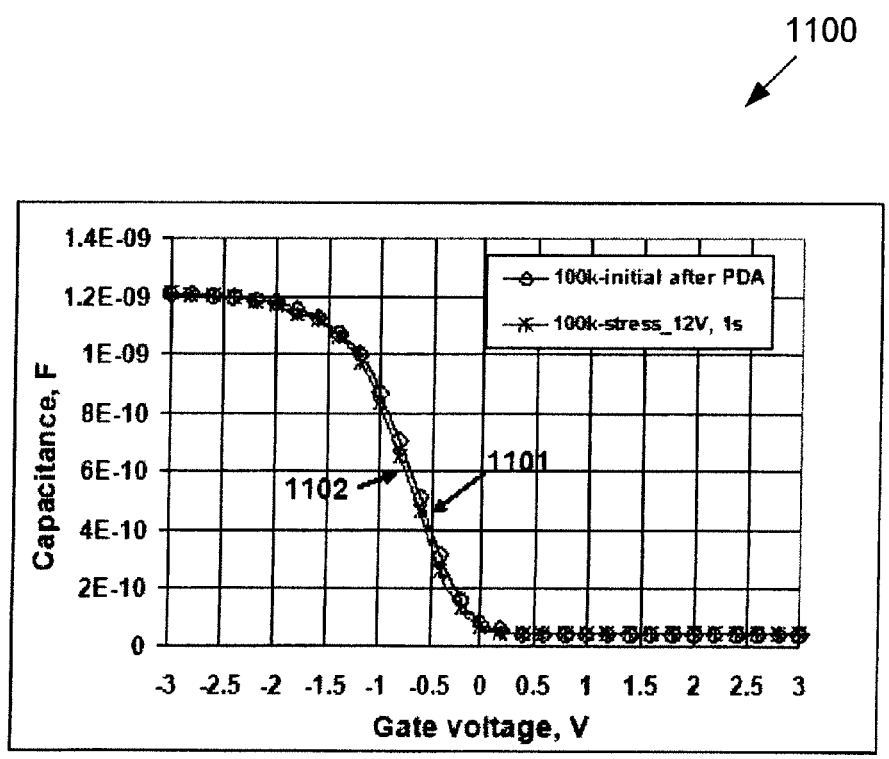
FIG. 11 is a graph that illustrates the capacitance-voltage (C-V) characteristics of an NMOS capacitor fabricated with a crystalline high-k dielectric stack of the present invention.

FIG. 11 is a graph 1100 that illustrates the capacitance-voltage (C-V) characteristics of an NMOS capacitor (0.5×0.5 $mm^2$) fabricated with the above-described A-O dielectric stack and a platinum gate electrode Line 1101 represents the C-V characteristics of the NMOS capacitor at a frequency of 100 kHz PDA. The initial charge stored in the A-O dielectric stack is negligible.

Line 1102 represents the C-V characteristics of the NMOS capacitor after the negative voltage stress of the A-O dielectric stack by applying −12 Volts to the gate electrode for 1 second. This negative voltage stress does not notably affect the $V_{fb}$ voltage (i.e., the charge stored by the A-O dielectric stack), thus demonstrating very low trap concentration in the developed A-O dielectric stack. From the C-V measurements of graph 1100, it can be determined that the EOT of the A-O dielectric stack is about 65 Angstroms.

Figure 12:
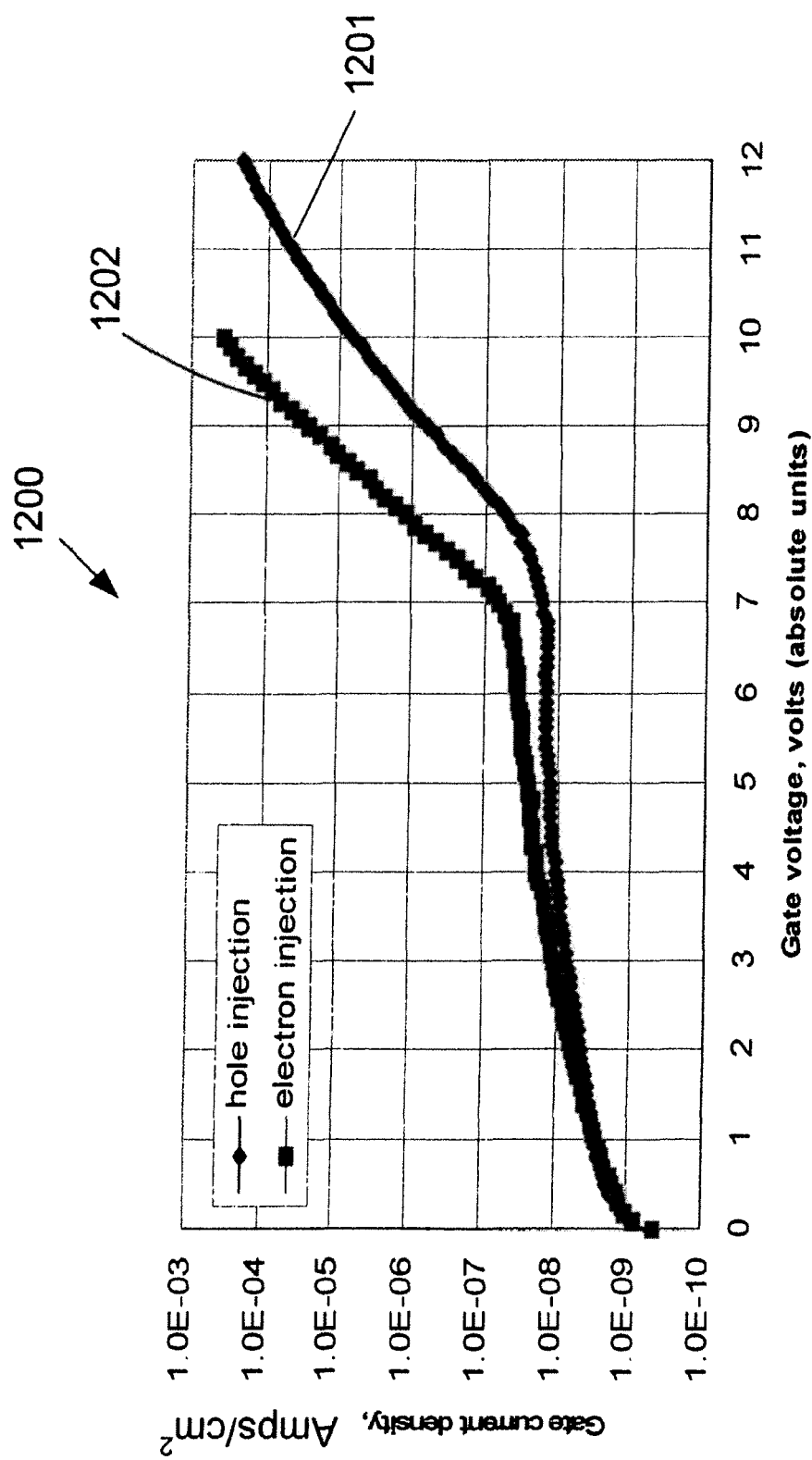
FIG. 12 is a graph that illustrates the current-voltage (I-V) characteristics of an NMOS capacitor fabricated with a crystalline high-k dielectric stack of the present invention.

FIG. 12 is a graph 1200 that demonstrates the current-voltage (I-V) characteristics of an NMOS capacitor (0.5×0.5 mm$^2$) fabricated with the above-described A-O dielectric stack (EOT=65 Angstroms) having a platinum gate electrode. Line 1201 represent the I-V characteristics of the NMOS capacitor measured with negative (hole injection) bias on the A-O dielectric stack. Line 1202 represents the I-V characteristics of the NMOS capacitor measured with positive (electron injection) bias on the A-O dielectric stack. The A-O dielectric stack is characterized by a low leakage current and an onset voltage exceeding 7 Volts. These results may be explained by the blocking effect of the crystallized alumina, along with the fact that trap-assisted current is strictly suppressed within the crystallized alumina layer.

Figure 13:
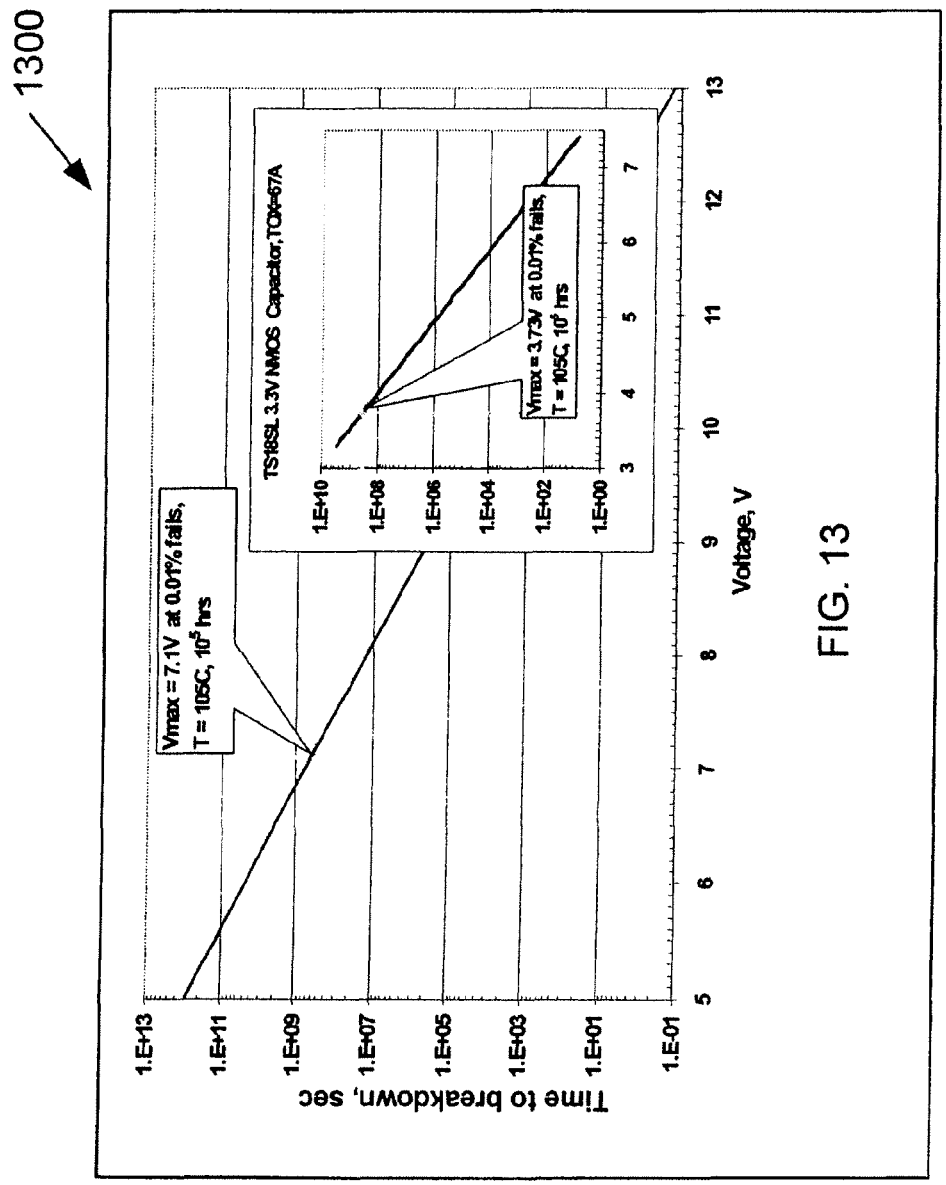
FIG. 13 is a graph that compares the reliability of a crystalline high-k dielectric stack of the present invention with the reliability of a thermal oxide having an equivalent oxide thickness.

FIG. 13 is a graph 1300 that compares the reliability of the A-O dielectric stack of the present example (EOT=65 Angstroms) and a thermal oxide having a thickness of about 67 Angstroms. As seen in FIG. 13, the A-O dielectric stack can guarantee a maximum operating voltage ($V_{MAX}$) of about 7.1 Volts (using a conservative acceleration scenario of degradation with a 0.01% failure rate at a temperature of 105° C. and a duration of 105 hours). In contrast, the thermal oxide can only guarantee a maximum operating voltage of about 3.7 Volts using the same conservative acceleration scenario of degradation.

As described above, the $Al_2O_3$—$SiO_2$ dielectric stack (EOT=65 Angstroms) of the present example shows unique integrity. The maximum operating voltage of this A-O stack is about twice as large as thermally grown silicon dioxide of the same electrical thickness. Thus, an A-O dielectric stack fabricated in accordance with the present invention demonstrates extremely low leakage currents and immunity to degradation. This A-O dielectric stack may be used for preparation of inter-poly dielectric in floating gate EEPROM memories or a dielectric stack in SONOS type memories (e.g., an NROM cell, or a TANOS cell as described, for example, by Y. Park et al., "Highly Manufacturable 32 Gb Multi Level NAND Flash with TANOS (Si-Oxide-Al2O3-TaN) Cell", IEDM Tech Dig, 6, 29 (2006)). This A-O dielectric stack can also serve as a high-voltage CMOS gate dielectric. In addition, the alumina of this A-O dielectric stack can be selectively etched, thereby leaving the silicon dioxide layer to be used as the gate dielectric layer of a low-voltage CMOS transistor.

As described above in connection with FIGS. 3A-3D, a crystalline ONA dielectric stack fabricated in accordance with the present invention can be used to implement an NROM (nitride read only memory) device. Due to the strong field decrease in the crystalline alumina layer, Fowler-Nordheim injection of holes from the substrate can be performed even if the silicon oxide layer of the ONA stack is relatively thick (e.g., 70 Angstroms). (See, M. Lisiansky, et al., Appl. Phys. Lett. 89, p. 3506 (2006)). Excellent data retention is observed for both trapped electrons and holes. Due to the reduced EOT of the crystalline ONA stack, Fowler-Nordheim programming/erase operations can be performed with gate voltages less than or equal to 14 Volts. The endurance of the NROM device is advantageously improved because the crystalline nitrided alumina layer exhibits suppressed charge trapping.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A method of fabricating a semiconductor device, comprising:
   forming an insulating layer over a semiconductor substrate;
   forming an amorphous high-k dielectric layer over the insulating layer;
   doping the amorphous high-k dielectric layer with nitrogen;
   heating the amorphous high-K dielectric layer to a temperature that equals or exceeds the crystallization temperature of the amorphous high-K dielectric layer, thereby transforming the amorphous high-K dielectric layer to a crystalline high-k dielectric layer, and causing nitrogen to diffuse from the amorphous high-k dielectric layer into the insulating layer;
   forming a conductive electrode layer over the crystalline high-k dielectric layer.

2. The method of claim 1, wherein the insulating layer comprises silicon oxide.

3. The method of claim 1, wherein the conductive electrode layer comprises metal or nitrided metal.

4. The method of claim 1, wherein the conductive electrode layer comprises polysilicon.

5. The method of claim 1, wherein the amorphous high-k dielectric layer comprises a metal oxide.

6. The method of claim 1, further comprising forming a silicon nitride/oxynitride layer over the insulating layer and forming the amorphous high-k dielectric layer over the silicon nitride/oxynitride layer.

7. The method of claim 1, further comprising removing a portion of the crystalline high-k dielectric layer over a first region of the substrate prior to forming the conductive electrode layer.

8. The method of claim 1, further comprising:
   forming a gate dielectric layer over the semiconductor substrate;
   forming a floating gate layer over the gate dielectric layer; and
   forming the insulating layer over the floating gate layer.

9. The method of claim 1, further comprising:
   forming an electrode structure comprising a metal over the semiconductor substrate; and
   forming the insulating layer over the electrode structure.

10. The method of claim 1, further comprising:
    forming a dielectric region over the semiconductor substrate;
    forming an electrode structure comprising a metal over the dielectric region; and
    forming the insulating layer over the electrode structure.

11. The method of claim 1, further comprising:
    forming a second high-k dielectric layer on the first high-k dielectric layer, wherein the first high-k dielectric layer has a first crystallization temperature and the second high-k dielectric layer has a second crystallization temperature; and annealing the first and second high-k dielectric layers at an anneal temperature that exceeds the first crystallization temperature.

12. The method of claim 1, wherein the amorphous high-k dielectric layer is doped with nitrogen by implanting nitrogen ions into the amorphous high-k dielectric layer.

13. The method of claim 1, wherein the amorphous high-k dielectric layer is doped with nitrogen by plasma treatment in a gas environment containing nitrogen atoms.

14. The method of claim 1, wherein the amorphous high-k dielectric layer is doped with nitrogen by a bake in a gas environment containing nitrogen atoms.

15. The method of claim 5, wherein the amorphous high-k dielectric layer comprises alloys of metal oxides.

16. The method of claim 5, wherein the amorphous high-k dielectric layer comprises alumina.

17. The method of claim 15, wherein the amorphous high-k dielectric layer comprises alloys of metal oxides with silicates and nitrides.

18. The method of claim 6, further comprising forming the silicon nitride/oxynitride layer to a thickness of about 10 to 20 Angstroms.

19. The method of claim 11, wherein the anneal temperature is less than the second crystallization temperature.

20. The method of claim 11, further comprising:
forming a third high-k dielectric layer on the second high-k dielectric layer; and
doping the third high-k dielectric layer with nitrogen.

21. The method of claim 20, wherein the first, second and third high-k dielectric layers comprise two or more different materials having two or more crystallization temperatures, the method further comprising annealing the first, second and third high-k dielectric layers at a temperature that equals or exceeds the highest crystallization temperature.

22. The method of claim 20, wherein the first, second and third high-k dielectric layers comprise two or more different materials having two or more crystallization temperatures, the method further comprising annealing the first, second and third high-k dielectric layers at a temperature that equals or exceeds the crystallization temperature of the first and third high-k dielectric layers.

23. The method of claim 12, further comprising implanting nitrogen with energies of about 10 eV to 15 keV, and a dosage in the range of E13-E16 $cm^{-2}$.

24. The method of claim 13, wherein the gas environment comprises $N_2$, $N_2O$, NO or $NH3$.

* * * * *